United States Patent [19]
Chang

[11] Patent Number: 6,160,287
[45] Date of Patent: Dec. 12, 2000

[54] FLASH MEMORY

[75] Inventor: Kuang-Yeh Chang, Taipei, Taiwan

[73] Assignee: United Microelectronics Corp., Hsinchu, Taiwan

[21] Appl. No.: 09/207,112

[22] Filed: Dec. 8, 1998

[51] Int. Cl.[7] .................................................. H01L 29/72
[52] U.S. Cl. ........................ 257/321; 257/319; 257/324; 257/331
[58] Field of Search ................................ 257/321, 324, 257/331, 319

[56] References Cited

U.S. PATENT DOCUMENTS

| | | | |
|---|---|---|---|
| 6,043,530 | 6/2000 | Chang | 257/321 |
| 6,075,267 | 6/2000 | Taji et al. | 257/321 |

*Primary Examiner*—Edward Wojciechowicz
*Attorney, Agent, or Firm*—Oblon, Spivak, McClelland, Maier & Neustadt, P.C.

[57] ABSTRACT

A flash memory. A tunnel oxide layer covers a part of a substrate. The tunnel oxide layer is covered by a floating gate. A first inter-poly dielectric layer is on the floating gate. A controlling gate is on the first inter-poly dielectric layer and extending in a strip shape along a first direction. A second inter-poly dielectric layer covers a first side wall of the floating gate, the first inter-poly dielectric layer, and the controlling gate. A polysilicon spacer is formed covering the second inter-dielectric layer. A drain region is next to a second side wall of the floating gate the first interpoly dielectric layer. and the controlling gate in the substrate. A source region is next to the spacer in the substrate. A select gate covering the controlling gate, the tunnel oxide layer. and the spacer extends along a second direction perpendicular to the first direction.

14 Claims, 6 Drawing Sheets

FLASH MEMORY

BACKGROUND OF THE INVENTION

1. Field of the Invention

The invention relates to a memory device, and more particularly, to a flash memory.

2. Description of the Related Art

Electrically erasable and programmable read only memory (EEPROM) is currently one the most widely used memory devices applied in personal computers and electronic equipment. A memory cell in a early developed conventional EEPROM comprises a transistor with a floating gate to achieve the operations of writing, erasing, and storing data while electrical shut down. This conventional memory cell typically occupies a large surface area. The data access speed is between 150 ns to 200 ns. A lately developed memory cell has a faster data access speed ranged between 70 ns to 80 ns. This memory cell is named as a flash memory by Intel Co.

In a transistor of a conventional flash memory, the hot electron effect is applied for data storing, and the Fowler-Nordheim tunneling effect is applied for data erasure. While storing data. a high voltage of 8V is applied between the drain region and the source region. The controlling gate is biased with the same high voltage at the same time. The hot electrons may thus flow out of the source region. While approaching the drain region these hot electrons tunnel through the oxide layer and are trapped in the floating gate. This is the so-called drain side injection operation. The threshold voltage of the floating gate is enhanced, and the object of storing data is achieved. By applying a positive voltage to the source region and a negative voltage to the controlling gate, the electrons trapped in the floating gate flow out of the floating gate and tunnel through the oxide layer, and thus, the stored data are erased. The floating gate is retrieved to the status before data storing.

FIG. 1 shows a layout of a conventional flash memory. FIG. 2, 3, 4 are cross sectional views taken along a cutting line I—I in FIG. 1, and FIG. 5 and 6 are cross sectional views taken along the cutting line II—II in FIG. 1. The cross sectional views of FIG. 3 to FIG. 6 show a conventional process for fabricating a flash memory.

Referring to both FIG. 2 and FIG. 5, a substrate 10 is provided. A pad oxide layer (not shown) is formed on the substrate 10. Using local oxidation, a field oxide layer 14 is formed to define an active region of the substrate 10. Using wet etching, the pad oxide layer is removed. Using thermal oxidation, a tunnel oxide layer 12 with a thickness of 100 Å is formed on the substrate 10. A polysilicon layer having a thickness of 1500 Å is formed on the tunnel oxide layer 12. Using photolithography and etching process, the polysilicon layer is patterned and then denoted by a reference numeral 16 in the figures.

An inter-poly dielectric layer with a thickness of 250A is formed to cover the polysilicon layer 16. Another polysilicon layer with a thickness of 3000 Å is formed. Using photolithography and etching process, the polysilicon layer is patterned and denoted by a reference numeral 20 as shown in the figure. Using the polysilicon layer 20 as a mask. a etching process is performed on the polysilicon layer 16 until the substrate 10 is exposed. Thus, a gate of a flash memory is formed by the polysilicon layer 20, the inter-poly dielectric layer 18. the polysilicon layer 16. and the tunnel oxide layer 12.

A photo-resist layer 21 is formed to cover a part of the substrate 10, while the exposed part of the substrate 10 includes the substrate 10 at a side of the gate. By performing heavy phosphorus ion implantation with a tile angle, the exposed substrate 10 is doped. An annealing process is performed to form a tunnel diffusion region 24. The tunnel diffusion region 24 extends toward a region under the gate.

In FIG. 3. the photo-resist layer 21 is removed. Using the polysilicon layer 21 as a mask. a heavy arsenic ion implantation is performed on the substrate 10 to form a source region 22a and a drain region 22b. The source region 22a is encompassed by the tunnel diffusion region 24.

Referring to both FIG. 4 and FIG. 6, a dielectric layer 30 is formed to cover the substrate 10. Using photolithography and etching, a contact window 32 is formed to penetrate through the dielectric layer 30 and to expose the drain region 22b. A metal layer 34 is formed to fill the contact window 32, so as to couple with the drain region 22b. The metal layer 34 is used as a bit line.

In the above conventional flash memory, the programming step is operated by hot electrons injected from aside of the drain region. Therefore, a high voltage (8V) is require to provide a high current. An over-erase effect thus often occurs.

In addition. the dimension of the flash memory is restricted by the size of the contact window 32. This flash memory can thus only be shrunk to a certain extend in size. With the formation of the field oxide, the shrinkage is further limited. The low level of planarization is also another drawback for using the field oxide layer. Moreover, the contact window is filled with a metal layer as a bit line, the interference by the reflection from the metal layer is inevitable.

SUMMARY OF THE INVENTION

It is therefore an object of the invention to provide a flash memory. The flash memory adapts the mechanism of source side injection, so that a programming current of about $10^2$ to $10^3$ smaller than the conventional drain side injection type flash memory is required. Since the operating current is greatly reduced, the flash memory can be applied for low voltage and low power devices. The flash memory comprises a self-aligned source side injection gate. and thus, a small cell size is achieved. In addition, the flash memory has a flat cell structure with good planarity.

To achieve these objects and advantages, and in accordance with the purpose of the invention, as embodied and broadly described herein, the invention is directed towards a flash memory. A tunnel oxide layer covers a part of a substrate. The tunnel oxide layer is covered by a floating gate. A first inter-poly dielectric layer is on the floating gate. A controlling gate is on the first inter-poly dielectric layer and extending in a strip shape along a first direction. A second inter-poly dielectric layer covers a first side wall of the floating gate, the first inter-poly dielectric layer, and the controlling gate. A polysilicon spacer is formed covering the second inter-dielectric layer. A drain region is next to a second side wall of the floating gate the first interpoly dielectric layer. and the controlling gate in the substrate. A source region is next to the spacer in the substrate. A select gate covering the controlling gate, the tunnel oxide layer. and the spacer extends along a second direction perpendicular to the first direction.

It is to be understood that both the foregoing general description and the following detailed description are exemplary and explanatory only and are not restrictive of the invention, is claimed:

DESCRIPTION OF THE PREFERRED EMBODIMENTS

Figure 1:
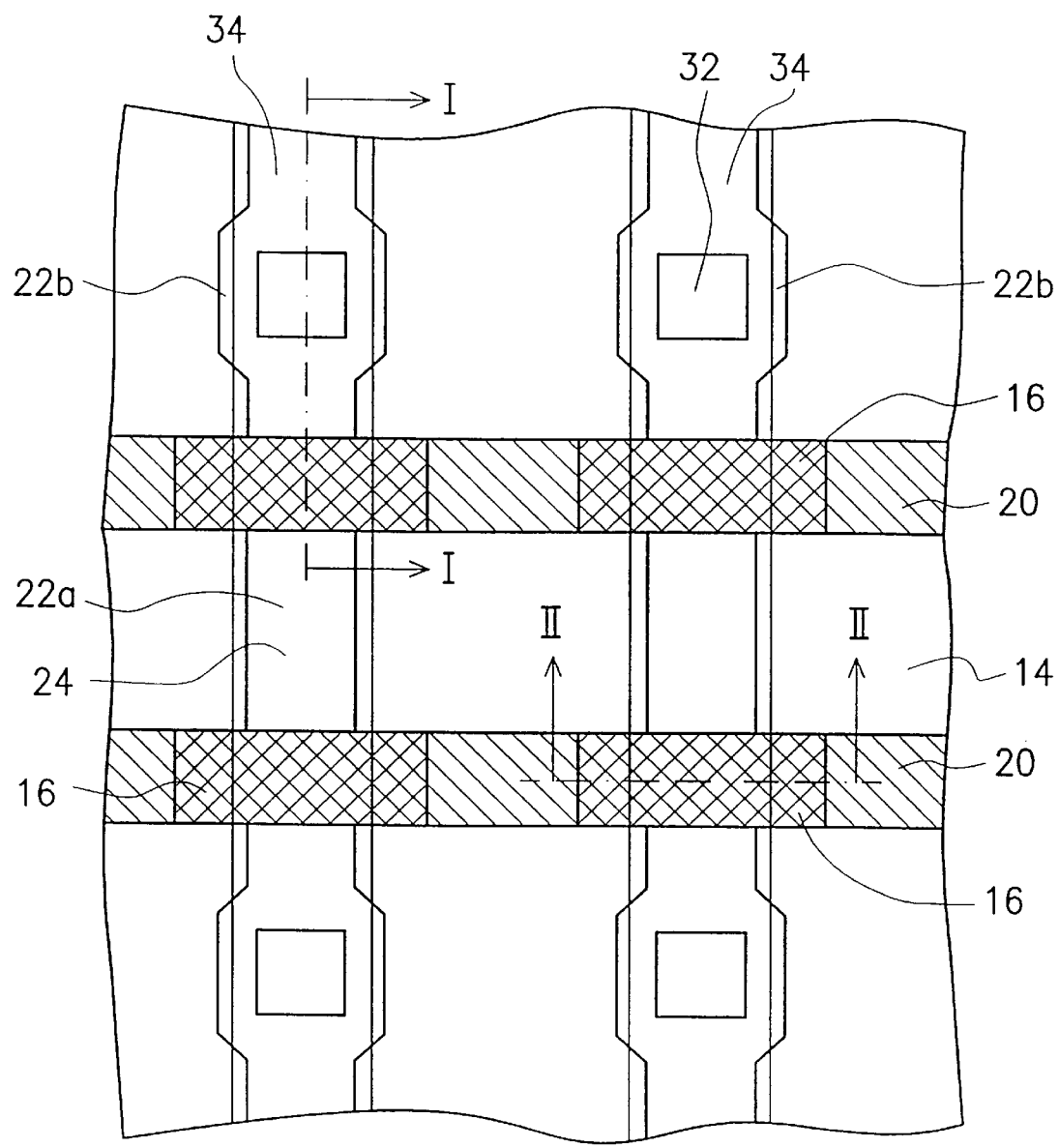
FIG. 1 shows a layout of a conventional flash memory.
Figure 2:
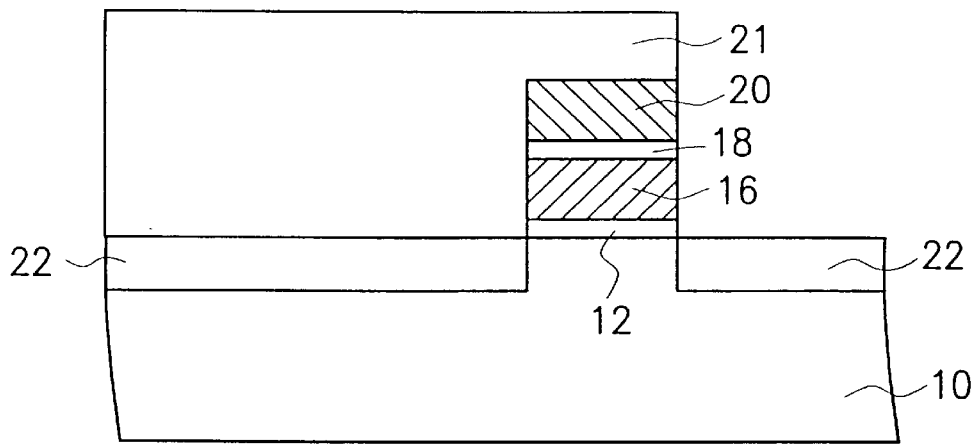
FIG. 2 to FIG. 4 are cross sectional views taken along the cutting line I—I in FIG. 1, showing a conventional fabrication process of the memory shown in FIG. 1.
Figure 3:
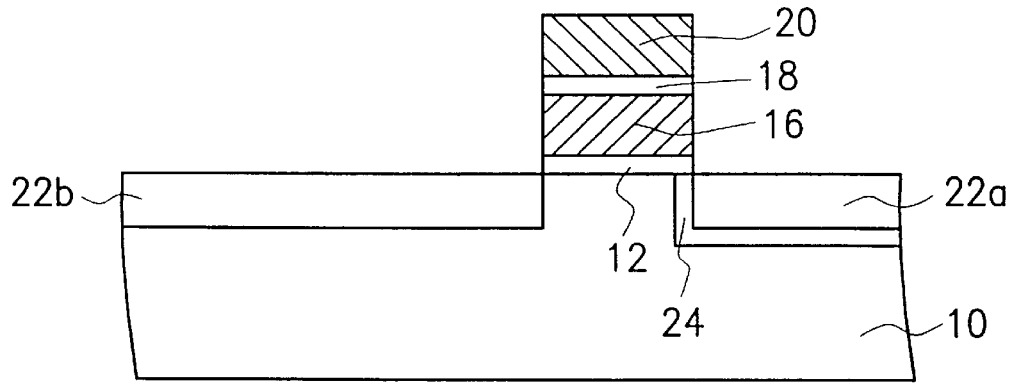
Figure 4:
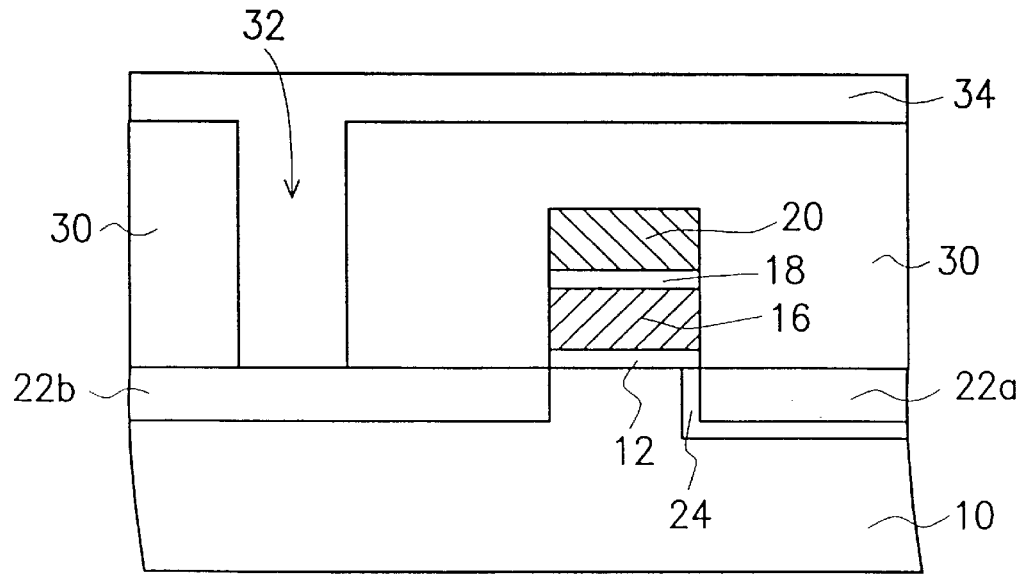
Figure 5:
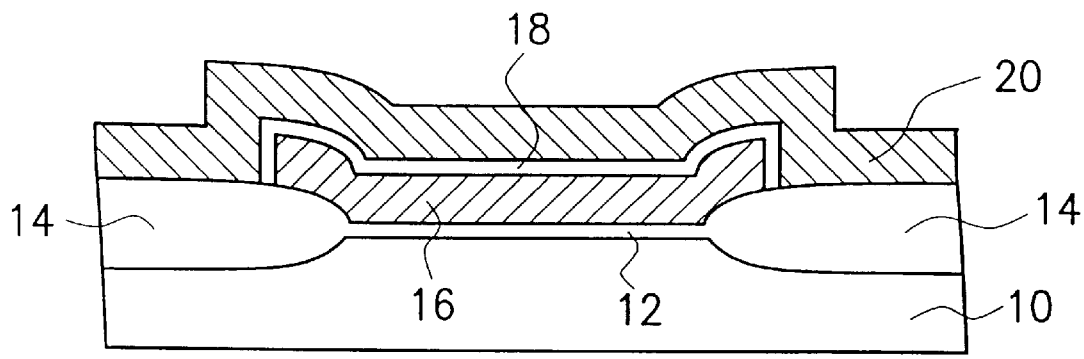
FIG. 5 and FIG. 6 are cross section views taken along the cutting line II—II in FIG. 1.
Figure 6:
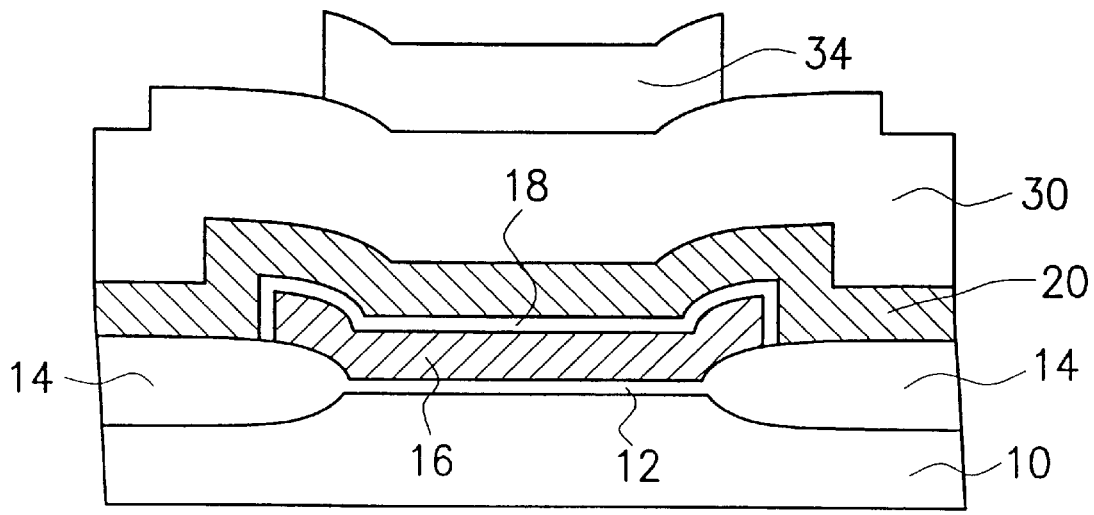
Figure 7:
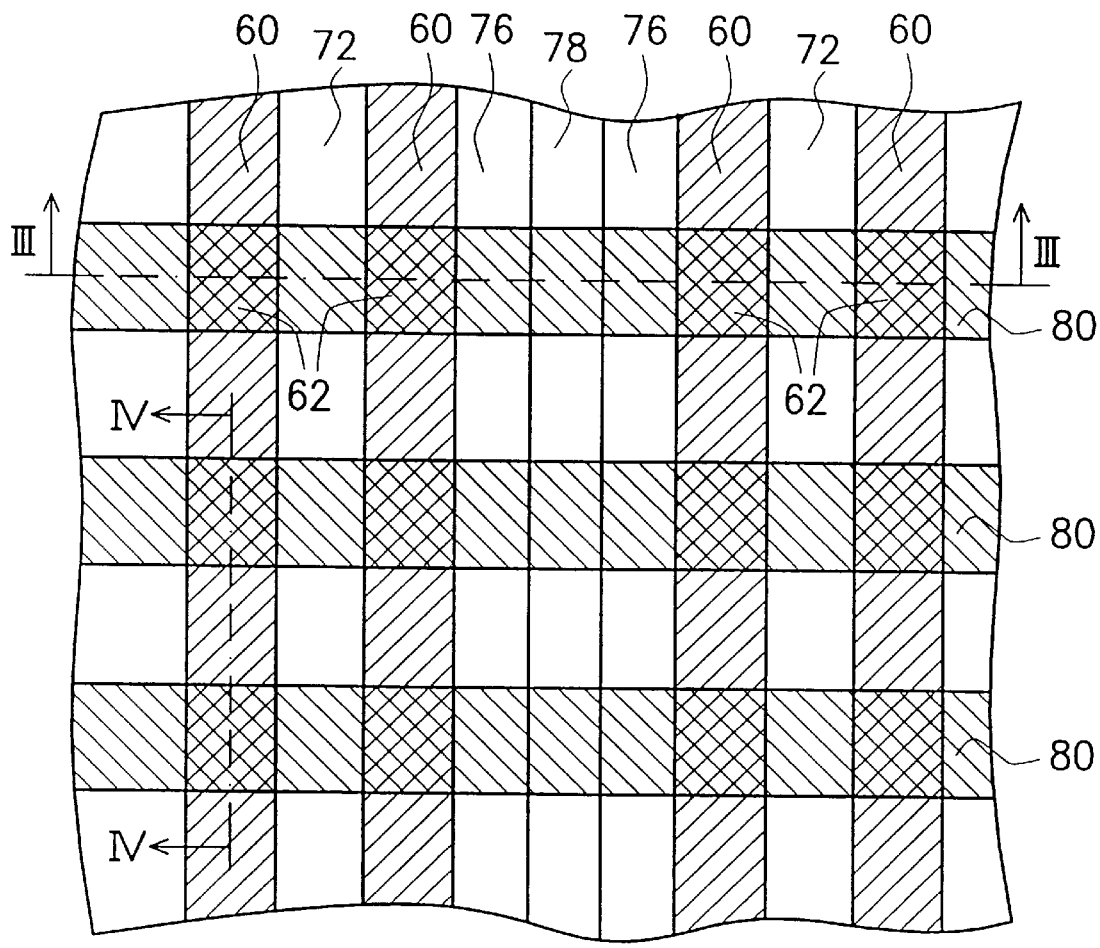
FIG. 7 shows a layout of a flash memory of a preferred embodiment according to the invention.

FIG. 7 shows a layout of a flash memory of a preferred embodiment according to the invention. FIG. 8 to FIG. 12 are cross sectional views showing the fabrication process of the flash memory shown in FIG. 7. The cross sectional views of FIG. 8 to FIG. 11 are taken along the cutting line III—III in FIG. 7, and the cross section view of FIG. 12 is taken along IV—IV in FIG. 7.

Figure 8:
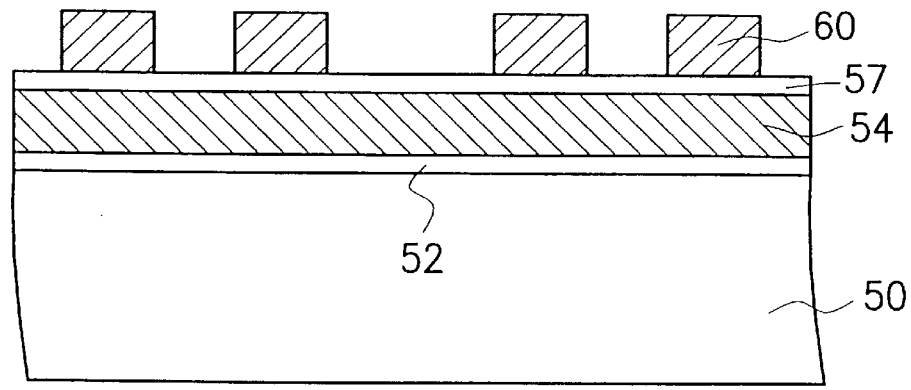
FIG. 8 to FIG. 12 are cross sectional views taken along the cutting line III—III in FIG. 7, showing the fabrication process of the flash memory shown in FIG. 7.

In FIG. 8. a semiconductor substrate 50 is provided. An oxide layer 52 with a thickness of about 85 Å to 100 Å is formed, for example, by thermal oxidation, on the substrate 50. A polysilicon layer 54 is formed on the oxide layer 52. The polysilicon layer 54 preferably having a thickness of about 3000 Å is formed by chemical vapor deposition (CVD), for example, low pressure CVD (LPCVD). Using photolithography and etching. the polysilicon layer 54 and the oxide layer 52 are patterned to expose the substrate 50 astride of the patterned polysilicon layer 54. Being patterned. the oxide layer 52 is used as a tunnel oxide layer.

Using, for example. LPCVD. an inter-poly dielectric layer 57 is formed to cover the polysilicon layer 54. The inter-poly dielectric layer 57 includes, for example, a stacked layer comprising oxide/nitride/oxide with a thickness of about 250 Å. On the inter-poly dielectric layer 57, a polysilicon layer with a thickness of about 3000 Å is formed CVD, for example. by LPCVD.

The polysilicon layer is then defined to be used as a controlling gate. The patterned polysilicon layer is then denoted by a reference numeral 60.

Figure 9:
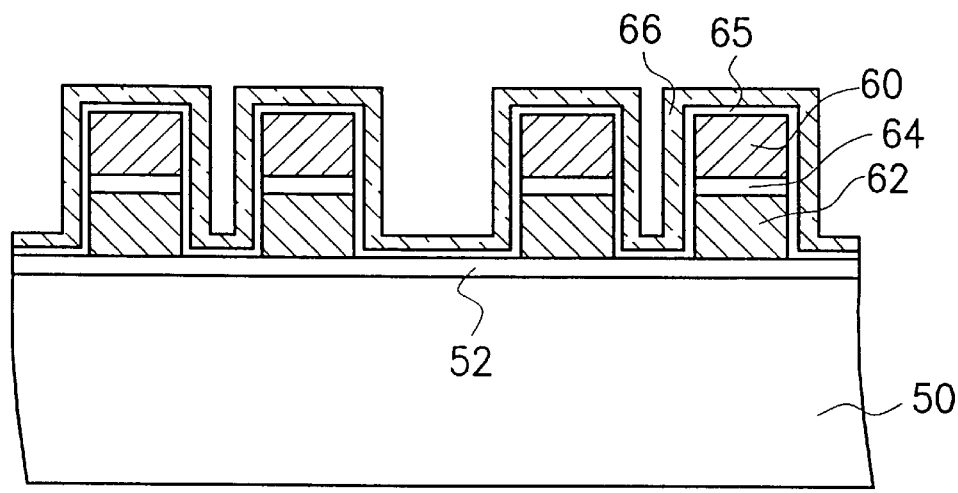

In FIG. 9. using the polysilicon layer 60 as a mask, the exposed inter-poly dielectric layer 57 and the underlying patterned polysilicon layer 54 are removed. The polysilicon layer 60 is used as a controlling gate, while the remaining polysilicon layer 62 is used as a floating gate. Whereas, the controlling gate 60 and the floating gate 62 are isolated by the remaining inter-poly dielectric layer 64. Preferably, the controlling gate 60 is in a strip shape extending along a direction, while the floating gate 62 is in an island shaped covered by the controlling gate 60 with the inter-poly dielectric layer 64 to isolation from each other in between.

An inter-poly dielectric layer 70 is formed, for example, by LPCVD. along a surface profile of the substrate 50. Thus, both the polysilicon layer 60 and the tunnel oxide layer 52 are covered by the inter-poly dielectric layer 70. The material of the inter-poly dielectric layer 70 comprises oxide/nitride/oxide. Preferably. the inter-poly dielectric layer 70 has a thickness of about 350 Å. Using, for example. LPCVD, a polysilicon layer 66 is formed along the surface of the inter-poly dielectric layer 70.

Figure 10:
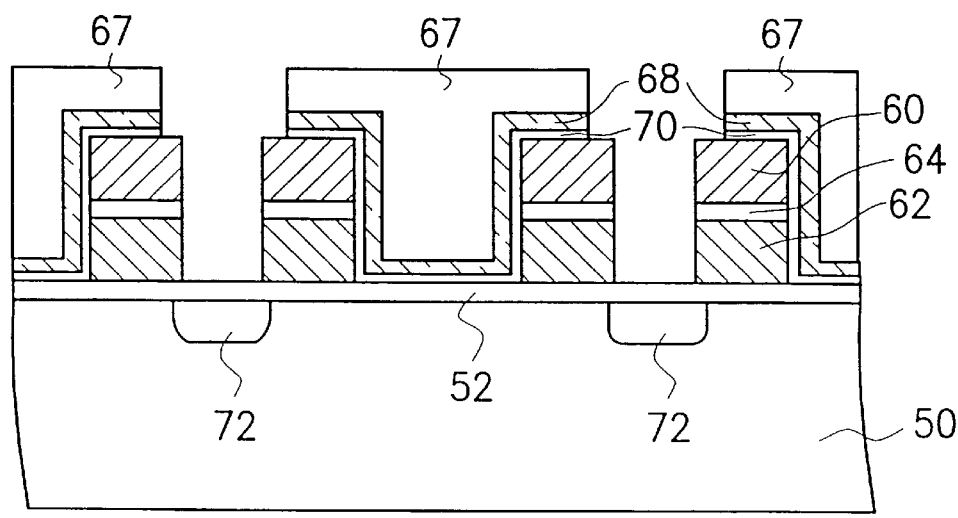

In FIG. 10. a photo-resist layer 67 is formed and defined to expose a part of the polysilicon layer 66. The exposed part of the polysilicon layer 66 is aligned over the substrate 50 without being covered by the polysilicon layer 62 covering thereon. Or alternatively, the exposed part of the polysilicon layer 66 includes both the area aligned over the substrate 50 without being covered by the polysilicon layer 62 covering thereon and a part of the polysilicon layer 60. The exposed part of the polysilicon layer 66 and the underlying inter-poly dielectric layer 70 are removed, so that a part of the top surface of the polysilicon layer 60. a side wall of the polysilicon layer 60, the inter-poly dielectric layer 64, the polysilicon layer 62, and a part of the tunnel oxide layer 52 are exposed. The remaining polysilicon layer is denoted as 68. Using both the photo-resist layer 67 and the polysilicon layer 60 as masks, the substrate 50 underlying the exposed inter-poly dielectric layer 70 is heavily doped, for example, by N-type ions such as phosphorus ions while a P-type substrate is in use. The doping process is performed by an ion implantation with a tilt implanted angle. A annealing process is performed to form a tunnel diffusion region 72 under the exposed tunnel oxide layer 52. The tunnel diffusion region 72 extends under a part of the substrate 50 under the polysilicon layer 62. The tunnel diffusion region 72 is also used as a drain region in this embodiment.

Figure 11:
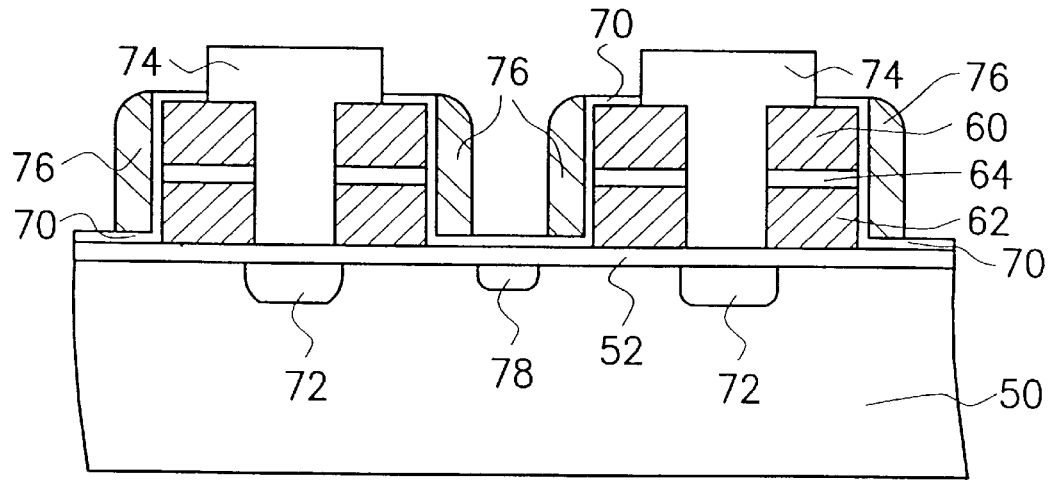
Figure 12:
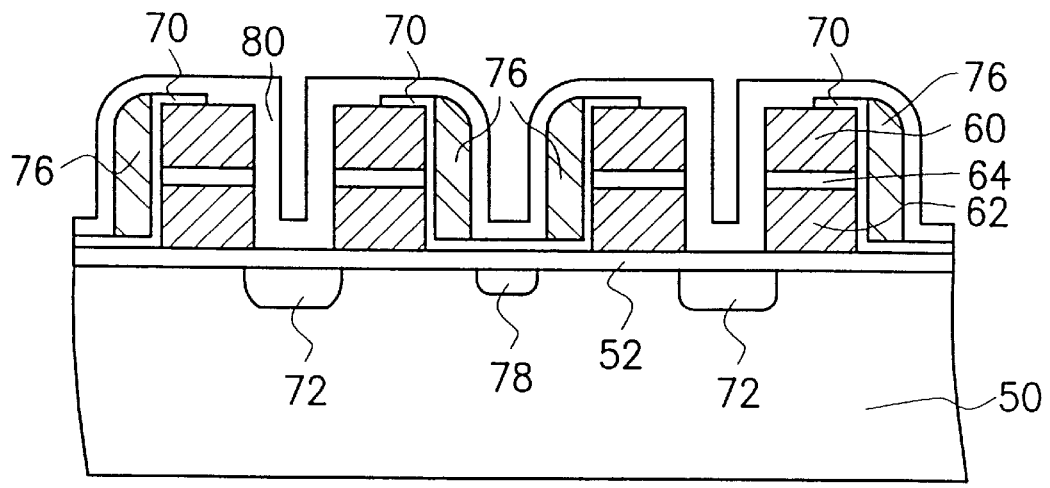

In FIG. 11. the photo-resist layer 67 is removed. Another photo-resist layer 74 is formed to cover the tunnel oxide layer 52 aligned over the tunnel diffusion region 72 and a part of the polysilicon layer 60. Preferably, the region covered by the photoresist layer 74 is the regioned covered by the photo-resist layer 67 (shown in FIG. 10). Using, for example, a dry etch, the polysilicon layer 68 is etched back to leave a spacer 76 to cover the inter-poly dielectric layer 70 on a side wall of the polysilicon layer 60, the inter-poly dielectric layer 64, and the polysilicon layer 62. As shown in the figure, in the embodiment. more than one gates are formed on the substrate 50. Each gate comprises the polysilicon layer 62 on the tunnel oxide layer 52. an inter-poly dielectric layer 64 on the polysilicon layer 62. and a polysilicon layer 60 on the inter-poly dielectric layer 64. Each of the gates has two side walls and a top surface. One of the side walls and the top surface are covered by the inter-poly dielectric layer 70. The inter-poly dielectric layer 70 on a first side wall is covered by the spacer 76, while the second side wall is exposed after the photo-resist layer 74 is removed.

Using the polysilicon layer 60 as a mask, a self-aligned ion implantation is performed on the substrate 50 underlying the exposed inter-poly dielectric layer 70 to form a heavily doped region 78 as a source region. The doped ions include, for example, N-type ions such as arsenic ions while a P-type substrate is in use. The source region 78 has a orthographic distance to the gate. This orthographic distance is about the thickness of the spacer 76.

In this embodiment. N-type ions are implanted to form the tunnel diffusion region 72 and the heavily doped region 78 while a P-type substrate 50 is provided. It is appreciated that P-type tunnel diffusion region and heavily doped region may also be formed instead of N-type doped region while an N-type substrate is in use. The fabrication method is the same and the device can be formed by interchanging P into N, and N into P.

Figure 13:
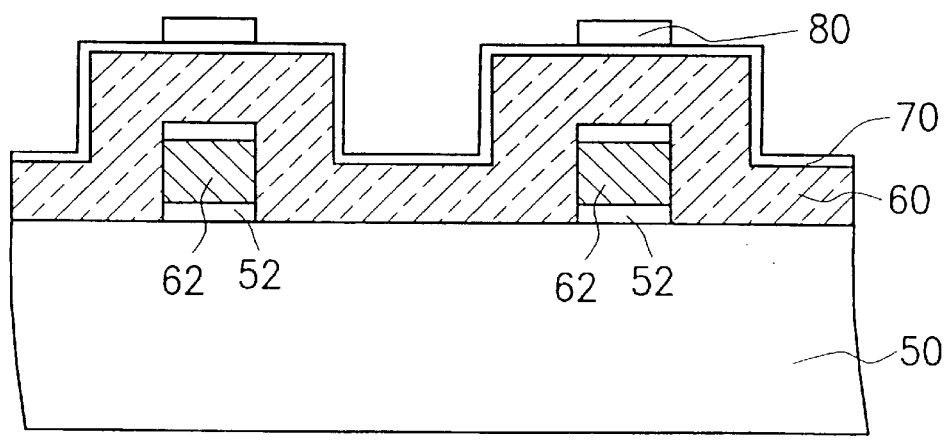
FIG. 13 is a cross sectional view taken along the cutting line IV—IV in FIG. 7.

Referring to both FIG. 12 and FIG. 13, after the formation of the heavily doped region 78. the photo-resist layer 74 is removed. A metal silicide layer 80, for example, a tungsten silicide (WSi$_2$) layer formed by CVD, is formed along the substrate surface profile. The metal suicide layer 80 is defined as the select gate layer in the flash memory. The select gate layer 80 extends towards a direction perpendicular to the extending direction of the controlling gate. that is, the polysilicon layer 60. Both the spacer 76 and the metal suicide layer 80 provide a good conductance, so that the resistance of the polysilicon of the gate is reduced to about ⅓ to ¼ of the conventional one.

In the invention. the source region 78 is formed by a self-aligned ion implantation with the spacer 76 as a mask. A source side injection method is used to provide a high programming efficient and a low access current, for example, of about 100 to 1000 $\mu$A. Therefore, a high voltage applied in a conventional flash memory is not required for this low voltage and low power operation.

Since the source region and drain region are formed by different doping processes, so that the characteristics of the flash memory can be controlled by adjusting the doping parameters.

The formation of the select gate avoid the over-erase effect caused by abnormal leakage current. Therefore. a normal operation of the flash memory is maintained.

The doped region 72 can also be used as a buried conductive line. A contact window is thus unnecessary. The additional metal layer formed in the conventional method to couple the source region is not required, so that the interference caused by the reflection from the metal layer is not existent.

The flash memory formed in the invention dose not employ the formation of a field oxide layer for isolation. so that a much improved planarity is achieved. Furthermore. without the formation of contact window and field oxide, the size of the memory can be greatly reduced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A flash memory, comprising:

a substrate;

an oxide layer, formed on the substrate;

a gate, having a first side wall and a second side wall formed on the substrate, wherein the gate further comprises a first polysilicon layer on the oxide layer, a first inter-poly dielectric layer on the first polysilicon layer, and a second polysilicon layer on the first inter-poly dielectric layer;

a second inter-poly dielectric layer, covering a part of top surface the gate and the first side wall of the gate;

a spacer, covering the second inter-poly dielectric layer on the first side wall;

a tunnel diffusion region, next to the second side wall in the substrate; and extending to a portion of the substrate under the gate;

a doped region. next to the spacer in the substrate; and a select gate layer, covering the gate, the spacer, the tunnel oxide layer, and extending perpendicular to the second polysilicon layer.

2. The flash memory according to claim 1, wherein the tunnel diffusion region comprises a phosphoric ion diffusion region.

3. The flash memory according to claim 1, wherein the tunnel diffusion region comprises a drain region.

4. The flash memory according to claim 1, wherein the doped region comprises an arsenic ion diffusion region.

5. The flash memory according to claim 1, wherein the doped region comprises a source region.

6. The flash memory according to claim 1, wherein the select gate is formed from metal silicide material.

7. A flash memory, comprising:

a substrate;

a tunnel oxide layer, covering a part of the substrate;

a floating gate, covering the tunnel oxide layer;

a first inter-poly dielectric layer, on the floating gate;

a controlling gate, on the first inter-poly dielectric layer and extending in a strip shape along a first direction:

a second inter-poly dielectric layer, covering a first side wall of the floating gate; the first inter-poly dielectric layer, and the controlling gate;

a polysilicon spacer, covering the second inter-dielectric layer;

a drain region, next to a second side wall of the floating gate, the first inter-poly dielectric layer, and the controlling gate in the substrate;

a source region, next to the spacer in the substrate; and a select gate, covering the controlling gate, the tunnel oxide layer, and the spacer and extendible along a second direction perpendicular to the first direction.

8. The flash memory according to claim 7, wherein the drain region includes a tunnel diffusion region.

9. The flash memory according to claim 7, wherein the drain region comprises a phosphoric ions doped region.

10. The flash memory according to claim 7, wherein the source region comprises an arsenic ion diffusion region.

11. The flash memory according to claim 7, wherein the drain region extends to a part of the substrate under the floating gate.

12. The flash memory according to claim 7, wherein the select gate is formed from metal suicide material.

13. The flash memory according to claim 7, wherein the floating gate includes a polysilicon layer.

14. The flash memory according to claim 7, wherein the controlling gate includes a polysilicon layer.

* * * * *